(12) United States Patent
Morishita et al.

(10) Patent No.: US 11,579,537 B2
(45) Date of Patent: Feb. 14, 2023

(54) PATTERN INSPECTION METHOD AND PHOTOMASK FABRICATION METHOD

(71) Applicant: KIOXIA CORPORATION, Tokyo (JP)

(72) Inventors: Keiko Morishita, Yokohama Kanagawa (JP); Kosuke Takai, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/184,442

(22) Filed: Feb. 24, 2021

(65) Prior Publication Data

US 2021/0294225 A1 Sep. 23, 2021

(30) Foreign Application Priority Data

Mar. 23, 2020 (JP) .............................. JP2020-050574

(51) Int. Cl.
*G03F 7/20* (2006.01)
*H01L 21/027* (2006.01)

(52) U.S. Cl.
CPC ........ *G03F 7/70641* (2013.01); *G03F 7/7065* (2013.01); *G03F 7/70625* (2013.01); *H01L 21/027* (2013.01)

(58) Field of Classification Search
CPC ............. G03F 7/70641; G03F 7/70625; G03F 7/7065; G03F 7/70433; G03F 1/38; G03F 7/70308; G03F 7/70241; G03F 7/70258; G03F 7/706; G03F 9/7026; H01L 21/027; H01L 21/0274; H01L 22/24; H01L 22/12; H01L 22/20

See application file for complete search history.

(56) References Cited

U.S. PATENT DOCUMENTS

| | | | |
|---|---|---|---|
| 6,774,043 B2 | 8/2004 | Yamaguchi et al. | |
| 7,436,507 B2 | 10/2008 | Moribe | |
| 7,507,508 B2 | 3/2009 | Watanabe et al. | |
| 2006/0199089 A1* | 9/2006 | Watanabe | G03F 7/70641 430/30 |
| 2019/0079412 A1* | 3/2019 | Mizuta | G03F 7/70241 |

FOREIGN PATENT DOCUMENTS

| | | | |
|---|---|---|---|
| JP | 2006-186177 A | | 7/2006 |
| JP | 2008256671 A | * | 10/2008 |

* cited by examiner

*Primary Examiner* — Mesfin T Asfaw
(74) *Attorney, Agent, or Firm* — Kim & Stewart LLP

(57) ABSTRACT

According to one embodiment, a pattern inspection method includes detecting a region of a photomask having a pattern that differs from a corresponding design, acquiring an exposure focus shift information including an exposure focus shift amount of a portion of a substrate corresponding to the detected region of the photomask. The exposure focus shift amount for the detected region is acquired from the exposure focus shift information, and then a pass/fail determination for the detected region is performed based on an estimated pattern to be formed on the substrate.

20 Claims, 4 Drawing Sheets

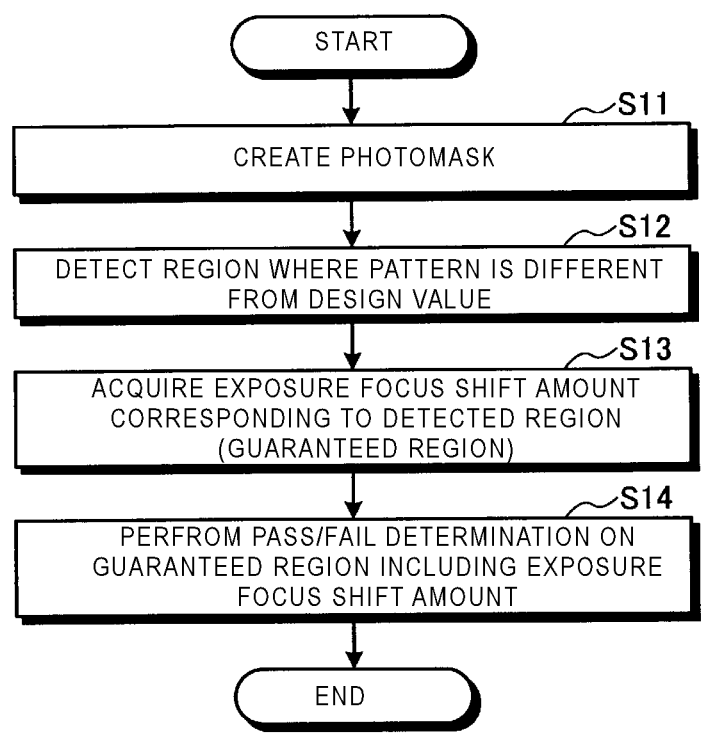

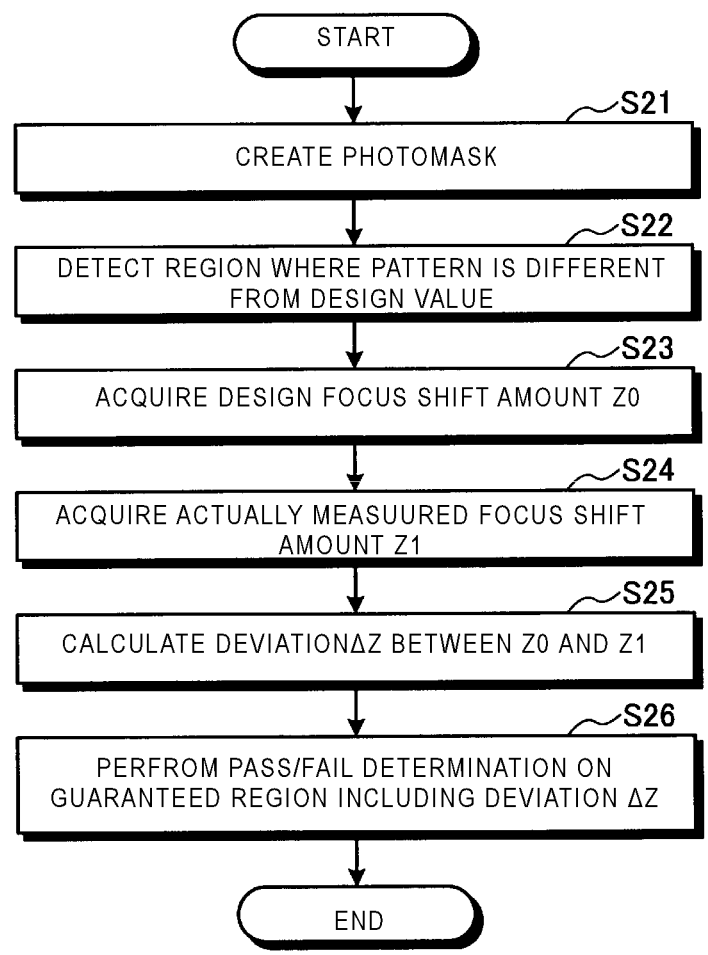

PATTERN INSPECTION METHOD AND PHOTOMASK FABRICATION METHOD

CROSS-REFERENCE TO RELATED APPLICATION

This application is based upon and claims the benefit of priority from Japanese Patent Application No. 2020-050574, filed Mar. 23, 2020, the entire contents of which are incorporated herein by reference.

FIELD

Embodiments described herein relate generally to a pattern inspection method and a photomask fabrication method.

BACKGROUND

In recent years, due to increased stacking ("three-dimensionalization") of components of memory devices, a step height difference between a memory cell region and a peripheral circuit region on a semiconductor wafer has become more significant. This difference in heights makes it difficult, from a standpoint of focal position correction functions in an exposure apparatus (photolithography tool), to perform the fabrication processes necessary when a pattern is being exposed on the wafer using a photomask. As such, a yield loss may occur due to pattern transfer failures. Therefore, a measure capable of reducing the yield loss caused by the step height differences on the wafer is desired.

BRIEF DESCRIPTION OF THE DRAWINGS

FIG. 5 is a flowchart showing processing of a first pattern guarantee method.

FIG. 6 is a flowchart showing processing of a second pattern guarantee method.

DETAILED DESCRIPTION

Embodiments provide a pattern inspection method and a photomask design method for photomask manufacturing. The embodiments are capable of reducing a deleterious effect of a height change between, for example, a cell region and a peripheral circuit region on a semiconductor wafer. Embodiments can avoid a manufacturing yield loss that might otherwise be caused by transfer failure, thus improving device yield produced with an exposure apparatus.

In general, according to one embodiment, a pattern inspection method includes detecting a first region of a photomask having a pattern that differs from a corresponding design value for the pattern; acquiring exposure focus shift information for patterning of a substrate by an exposure tool, the exposure focus shift information including an exposure focus shift amount for a portion of the substrate corresponding to the first region; acquiring the exposure focus shift amount corresponding to the first region from the exposure focus shift information; and performing a pass/fail determination for the first region based on an estimated pattern to be formed on the substrate by exposure of the first region of the photomask with the exposure tool utilizing the exposure shift amount for first region.

Next, example embodiments will be described with reference to the drawings.

[1] Principle of Embodiment

Figure 1:
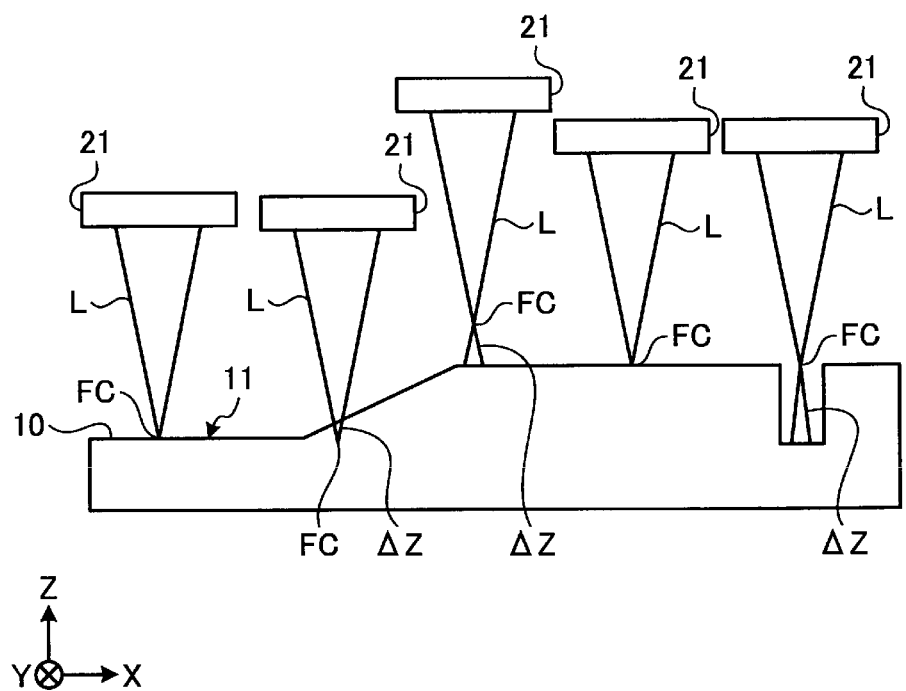
FIG. 1 is a diagram illustrating aspects related to an embodiment.

FIG. 1 is a diagram illustrating aspects related to a principle of an embodiment.

As shown in FIG. 1, a resist (film) 11 is formed on a surface of a wafer 10. The resist 11 is patterned by selective exposure. Therefore, exposure light L must be accurately transmitted to the resist 11 in a manner corresponding to the intended pattern to be formed in the resist 11. That is, for example, a projected image of a circuit pattern is formed on a surface of the resist 11. In the following description, unless otherwise stated, references to the surface of the wafer 10 refers to the surface of the resist 11 formed on the wafer 10.

As shown in FIG. 1, the surface of the resist 11, which is a pattern transfer surface on the wafer 10 as a semiconductor substrate, is not flat. That is, due to unevenness of a substructure below the resist 11, the resist 11 may be at different heights and there may be different levels, steps, or the like across the wafer.

An exposure apparatus that performs the exposure using a photomask 21 has a focus shift function that measures these height differences (referred to as "steps" in the following) on the surface of the resist 11 during the image transferring process and adjusts the focal position FC in a Z direction corresponding to the thickness direction of the wafer 10. However, it can be impossible to follow and account for all the steps. In general, the step height amount that can be compensated changes depending on a width of the step region and the location of the step on the wafer. Thus, there is a residual difference ΔZ that cannot be compensated and thus remains uncorrected. Hereafter, adjusting the focal position FC in the Z direction may be referred to as a focus shift. The residual difference ΔZ, which is a difference between a reference position of the focal position in the Z direction (for example, focal position of a normal pattern) and a position to which an actual focal position was shifted in the Z direction, may be referred to as a focus shift amount. In the present context, "following" means that focal position of the exposure apparatus is adjusted to a plane (least squares plane) that minimizes a sum of squares of distances from respective points in an exposed area in a substrate having steps.

If the residual difference ΔZ that cannot be followed (corrected) is within a range of a focus depth as calculated based on a pattern to be transferred and lighting and optical conditions, the pattern can still be transferred to the surface of the resist 11 on the wafer with desired accuracy.

However, when the residual difference ΔZ exceeds the range of the focus depth, the pattern cannot be transferred with desired accuracy, which causes transfer failure and a yield loss.

Particularly in recent years, the focus depth (depth of focus) has decreased in photolithography tools due to miniaturization of patterns to be transferred and complications related to the necessary exposure conditions. Furthermore, in a semiconductor memory, the difference that cannot be followed tends to increase as a circuit structure is structured in a more three-dimensional manner, so that it becomes difficult to transfer the pattern onto the surface of the resist with desired accuracy.

As to be described later, it can be determined whether an actual focal position for a photomask is within a range of a focus depth with respect to a surface position of a wafer before manufacturing the wafer. Alternatively, the focal position FC can always be set to be within the focus depth with respect to the surface position (surface shape) of the wafer by performing pattern transferring using a photomask provided with a substrate step corresponding to the residual difference ΔZ or an optical path difference adjusting member.

[2] Configuration of Photomask

Figure 2:
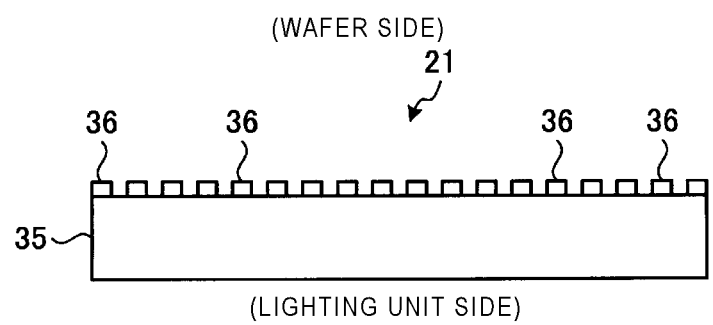
FIG. 2 is a diagram illustrating a configuration example of a photomask.

FIG. 2 is a diagram illustrating a configuration example of the photomask.

As shown in FIG. 2, light-shielding bodies 36 that have a uniform thickness are provided on a photomask substrate 35 of the photomask 21. The bodies 36 form a pattern to be transferred by light exposure to the resist 11 formed on the wafer 10.

Figure 3:
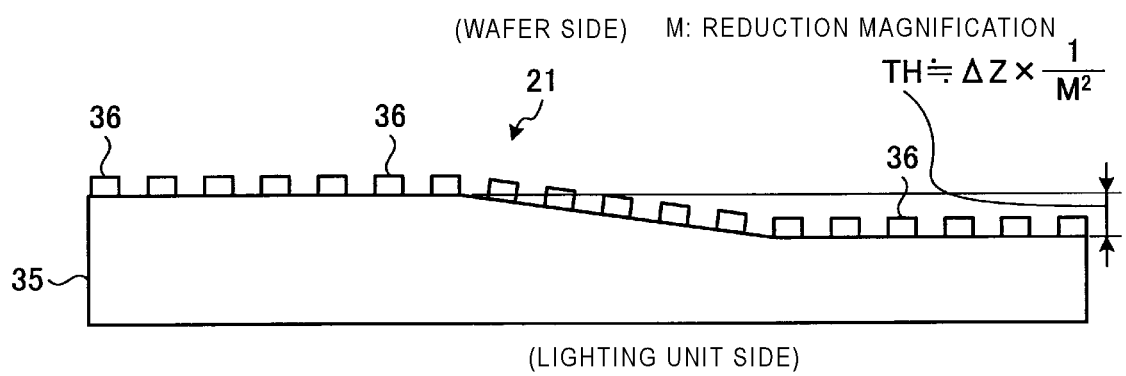
FIG. 3 is a diagram illustrating another configuration example of a photomask.

FIG. 3 is a diagram illustrating another configuration example of a photomask.

As shown in FIG. 3, there is a step (a difference in surface height) formed on the photomask substrate 35. The step is formed according to the residual difference ΔZ on the wafer 10.

More specifically, a step (thickness difference) TH of the photomask substrate 35 is converted to a thickness (or optical path length) shown in the following equation based on the residual difference ΔZ and a reduction magnification M of the exposure apparatus.

$$TH \approx \Delta Z \times 1/M^2$$

Here, the photomask substrate 35 has a slope corresponding to the step TH. The light-shielding bodies 36 that form a pattern to be transferred to be exposed to the resist 11 on the wafer 10 are provided on the photomask substrate 35 including on the sloped portion.

Figure 4:
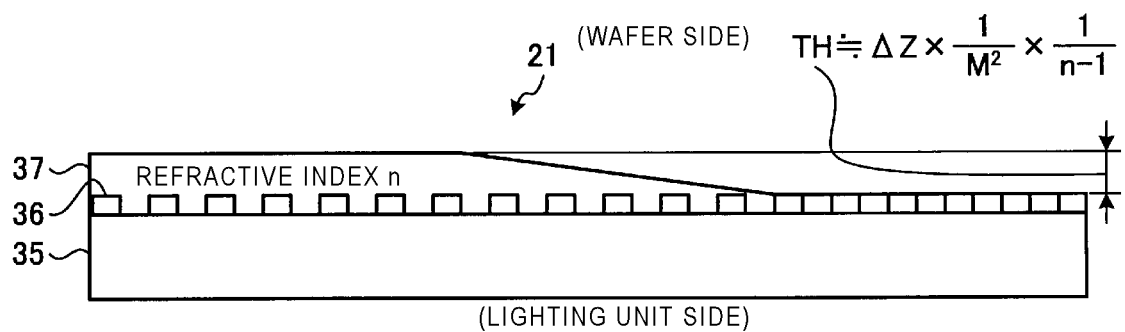
FIG. 4 is a diagram illustrating yet another configuration example of a photomask.

FIG. 4 is a diagram illustrating yet another configuration example of a photomask.

As shown in FIG. 4, the photomask 21 is provided with an optical path difference adjusting member 37 corresponding to the residual difference ΔZ on the wafer 10.

Therefore, the thickness of the photomask substrate 35 constituting the photomask 21 in FIG. 4 is constant.

The light-shielding bodies 36 are provided on a flat surface (wafer-side surface) of the photomask substrate 35.

The optical path difference adjusting member 37 is stacked on a wafer-side surface of the photomask substrate 35.

In this example, the step TH is provided using the optical path difference adjusting member 37. The thickness change of the optical path difference adjusting member 37 corresponds to a thickness (optical path length) TH shown in the following equation based on the residual difference ΔZ, the reduction magnification M, and a refractive index n of the optical path difference adjusting member 37.

$$TH \approx \Delta Z \times 1/M^2 \times 1/(n-1)$$

Here, the optical path difference adjusting member 37 has a sloped portion providing the thickness change.

By performing exposure using such a photomask, the residual difference ΔZ can be compensated. Therefore, the actual focal position FC of the exposure light can be fall within the range of the focus depth, and the pattern can be transferred on the surface of the resist on the wafer with desired accuracy.

[3] Pattern Inspection Method of Photomask

Next, a pattern inspection method for a photomask for which a residual difference ΔZ is generated in an exposure process performed on the wafer will be described. The pattern inspection method of the embodiment is performed as a part of a photomask fabrication process.

When there is a difference between the focus shift amount that can be implemented with an exposure apparatus and the actually required focus shift amount, a transfer failure as described above may occur, so that it is necessary to design the pattern in consideration of the difference between the focus shift amounts.

[3.1] First Pattern Inspection Method

FIG. 5 is a flowchart showing processing of a first pattern inspection method.

The processing is performed on a premise that as an initial photomask, a pattern of light-shielding bodies 36 is formed on a photomask substrate 35 having a uniform thickness (as shown in FIG. 2) without a step or an optical path difference adjusting member being formed on or in the photomask substrate 35.

First, a photomask is created (step S11).

Next, a photomask inspection device detects a region where a pattern of the created photomask and a corresponding design value (design pattern) are different (step S12).

In the following description, the detected region in which the pattern of the photomask and the corresponding design value (design pattern) are different is referred to as a guaranteed defect region.

Examples of the guaranteed defect region include a region where a shape defect in which a pattern (light-shielding body shape) of a light-shielding body (light-shielding film) is different from a design shape occurs, a region where an adhesion defect in which foreign substances are adhered to the formed pattern occurs, or the like.

The guaranteed defect region is not limited to one place on a photomask, and may occur in a plurality of places on the photomask.

When the pattern of the guaranteed defect region is significantly different from the design value, the pattern can be corrected by a photomask defect correction device.

In this pattern inspection method, an exposure focus shift amount corresponding to the guaranteed defect region is acquired as exposure focus shift information (step S13).

Here, in the exposure focus shift information, the residual difference ΔZ remaining after focus shift correction of the exposure apparatus and corresponding to the step (surface shape) of the surface of the wafer during exposure of the created photomask is estimated for each coordinate of a photomask exposure region.

Then, based on the acquired exposure focus shift information, an exposure focus shift amount of a guaranteed defect region of the photomask is acquired, and a pattern to be transferred by the exposure apparatus to the wafer when the focus shift was performed from a normal position is predicted, and a pass/fail determination as to whether a device defect occurs is performed for each guaranteed defect region (step S14).

In this case, a pattern image of the guaranteed defect region of the photomask to be transferred to the wafer can be predicted by an image quality evaluation device with the same wavelength and optical system as the exposure apparatus, or by performing a lithography simulation using a contour image of the created photomask pattern.

When there is even one guaranteed defect region that is determined as fail as a result of the pass/fail determination, the pattern of the guaranteed defect region that is determined as fail may be corrected again, and the pass/fail determination may be performed again.

According to the first pattern inspection method, the pattern of the photomask can be reliably guaranteed.

A transmissive photomask is described above as an example, but the same can be applied to a reflective photomask.

[3.2] Second Pattern Inspection Method

FIG. 6 is a flowchart showing processing of a second pattern inspection method.

The following description is made on a premise that as the photomask, a photomask itself has the focus shift function as described in FIGS. 3 and 4.

First, a photomask having a focus shift function based on a step or an optical path difference adjusting member on a photomask substrate is created (step S21).

Next, a photomask inspection device detects a guaranteed defect region where a pattern of the created photomask and a corresponding design value (design pattern) are different (step S22).

Subsequently, a design focus shift amount Z0 obtained based on the design pattern or the like and corresponding to each guaranteed defect region is acquired (step S23).

Next, a focus shift amount Z1 which is an actually measured focus shift amount is acquired (step S24).

Here, the actually measured focus shift amount is a focus shift amount actually measured and calculated after the pattern of the photomask is created.

In the case of the photomask shown in FIG. 3, a height of a pattern surface of the photomask is measured, and the focus shift amount Z1 is calculated based on the height difference from a reference surface and exposure parameters during the exposure performed by the exposure apparatus.

In the case of the photomask on which the optical path difference adjusting member 37 is formed as shown in FIG. 4, the focus shift amount Z1 is calculated based on thickness distribution of the optical path difference adjusting member 37, a refractive index n of the optical path difference adjusting member 37, and exposure parameters for the exposure by the exposure apparatus.

In any of the above photomask configurations, the focus shift amount Z1 can be calculated by measuring a focus shift amount from the reference surface using an image quality evaluation device with the same wavelength and optical system as the exposure apparatus.

Next, the residual difference $\Delta Z$ (=Z0−Z1), which is a deviation between the acquired design focus shift amount Z0 and the focus shift amount Z1, is calculated (step S25).

Then, based on the residual difference $\Delta Z$, an exposure focus shift amount of a guaranteed defect region of the photomask is acquired, and the pattern transferred to the wafer when the focus shift is performed from a normal position is predicted, and a pass/fail determination as to whether a device defect occurs is performed for each guaranteed defect region (step S26).

In this case, as the first pattern inspection method, a pattern image of the guaranteed defect region can be predicted by an image quality evaluation device with the same wavelength and optical system as the exposure apparatus, or performing by a lithography simulation using a contour image of the created photomask pattern.

When there is even one guaranteed defect region that is determined as fail in the pass/fail determination, the pattern of the guaranteed defect region that is determined as fail may be corrected, and the pass/fail determination may be performed again.

A transmissive photomask is described above as an example, but the same can be applied to a reflective photomask.

[3.3] Effects of Pattern Inspection

According to each of the above pattern inspection methods, the pattern of the photomask can be reliably guaranteed, as a result, it is possible to manufacture a photomask capable of reducing an effect of a step between a cell region and a peripheral circuit region of a semiconductor wafer, reducing the yield loss caused by the transfer failure, and improving the yield.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A pattern inspection method, comprising:
    detecting a first region of a photomask having a pattern that differs from a corresponding design value for the pattern;
    acquiring exposure focus shift information for patterning of a substrate by an exposure tool, the exposure focus shift information including an exposure focus shift amount for a portion of the substrate corresponding to the first region, the exposure focus shift information reflecting a difference between a required focus shift amount to compensate for a surface height of the substrate in the portion corresponding to the first region and a maximum focus exposure shift that can be provided by the exposure tool;
    acquiring the exposure focus shift amount corresponding to the first region from the exposure focus shift information; and
    performing a pass/fail determination for the first region based on an estimated pattern to be formed on the substrate by exposure of the first region of the photomask with the exposure tool utilizing the exposure shift amount for first region.

2. The pattern inspection method according to claim 1, wherein the pattern is on a photomask substrate having a uniform thickness.

3. The pattern inspection method according to claim 1, wherein the substrate has an upper surface with regions of different height.

4. The pattern inspection method according to claim 1, wherein detecting the first region comprises forming an image corresponding to the pattern of the photomask on a test substrate and inspecting the pattern formed on the test substrate.

5. The pattern inspection method according to claim 1, wherein detecting the first region comprises optically inspecting the photomask.

6. The pattern inspection tool according to claim 1, wherein the surface height of the substrate varies portion to portion such that the surface height at the portion of the substrate corresponding to the first region is different from the surface height at another portion of the substrate adjacent to the portion of the substrate corresponding to the first region.

7. A pattern inspection method, comprising:
    detecting a first region of a photomask in which a pattern and a corresponding design value are different;
    acquiring a design focus shift amount corresponding to the first region;

acquiring an actually measured focus shift amount for a surface height of a substrate to be patterned in a portion of the substrate corresponding to the first region of the photomask;

calculating a residual difference for the first region based on the design focus shift amount and the actually measured focus shift amount; and performing a pass/fail determination on the first region based on the residual difference.

8. The pattern inspection method according to claim 7, wherein the pattern is formed on a photomask substrate having a uniform thickness.

9. The pattern inspection method according to claim 7, wherein the pattern is formed on a photomask substrate having regions of different thickness.

10. The pattern inspection method according to claim 7, wherein the pattern is formed on a photomask substrate having a sloping region between regions of different thicknesses.

11. The pattern inspection method according to claim 7, wherein detecting the first region comprises forming an image corresponding to the pattern of the photomask on a test substrate and inspecting the pattern formed on the test substrate.

12. The pattern inspection method according to claim 7, wherein detecting the first region comprises optically inspecting the photomask.

13. A photomask fabrication method, comprising:
preparing a photomask with a pattern; and
performing the pattern inspection method according to claim 7 on the prepared photomask.

14. The photomask fabrication method according to claim 13, wherein the prepared photomask comprises a photomask substrate having regions of different thickness.

15. The photomask fabrication method according to claim 13, wherein the prepared photomask comprises a photomask substrate having a uniform thickness.

16. The photomask fabrication method according to claim 13, wherein the prepared photomask comprises a photomask substrate having a sloping region between regions of different thicknesses.

17. A photomask fabrication method, comprising:
preparing a photomask with a pattern;
detecting a first region of the photomask in which the pattern differs from a corresponding design value;
acquiring exposure focus shift information for patterning of a substrate by an exposure tool, the exposure focus shift information including an exposure focus shift amount for a portion of the substrate corresponding to the first region, the exposure focus shift information reflecting a difference between a required focus shift amount to compensate for a surface height of the substrate in the portion corresponding to the first region and a maximum focus exposure shift that can be provided by the exposure tool;
acquiring the exposure focus shift amount corresponding to the first region from the exposure focus shift information; and
performing a pass/fail determination for the first region based on an estimated pattern to be formed on the substrate by exposure of the first region of the photomask with the exposure tool utilizing the exposure shift amount for first region.

18. The photomask fabrication method according to claim 17, wherein the photomask comprises a photomask substrate having a uniform thickness.

19. The photomask fabrication method according to claim 17, wherein detecting the first region comprises forming an image corresponding to the pattern of the photomask on a test substrate and inspecting the pattern formed on the test substrate.

20. The photomask fabrication method according to claim 17, wherein detecting the first region comprises optically inspecting the photomask.

* * * * *